(12) United States Patent
Camacho et al.

(10) Patent No.: US 7,919,848 B2
(45) Date of Patent: Apr. 5, 2011

(54) INTEGRATED CIRCUIT PACKAGE SYSTEM WITH MULTIPLE DEVICES

(75) Inventors: Zigmund Ramirez Camacho, Singapore (SG); Henry Descalzo Bathan, Singapore (SG); Abelardo Jr Hadap Advincula, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 67 days.

(21) Appl. No.: 11/833,898

(22) Filed: Aug. 3, 2007

(65) Prior Publication Data

US 2009/0032918 A1 Feb. 5, 2009

(51) Int. Cl.
*H01L 23/495* (2006.01)
*H01L 21/56* (2006.01)

(52) U.S. Cl. ........ 257/690; 257/666; 257/673; 257/676; 257/686; 257/777; 257/E23.031; 257/E23.032; 257/E23.052; 257/E21.499; 438/106

(58) Field of Classification Search .................. 257/777, 257/676, E23.031, 666, 673, 686, 690, E23.032, 257/E23.052, E21.499; 438/106
See application file for complete search history.

(56) References Cited

U.S. PATENT DOCUMENTS

| | | | |
|---|---|---|---|
| 5,646,829 A * | 7/1997 | Sota ............... | 361/813 |
| 6,462,421 B1 | 10/2002 | Hsu et al. | |
| 6,603,072 B1 * | 8/2003 | Foster et al. ....... | 174/536 |
| 6,677,663 B1 | 1/2004 | Ku et al. | |
| 7,023,076 B2 * | 4/2006 | Khiang .............. | 257/678 |
| 7,045,887 B2 | 5/2006 | Karnezos | |
| 7,154,186 B2 | 12/2006 | Noquil et al. | |
| 7,163,842 B2 | 1/2007 | Karnezos | |
| 7,166,494 B2 | 1/2007 | Karnezos | |
| 7,169,642 B2 | 1/2007 | Karnezos | |
| 2002/0163015 A1 * | 11/2002 | Lee et al. ........ | 257/200 |
| 2003/0020177 A1 * | 1/2003 | Oka ................ | 257/777 |
| 2003/0197290 A1 * | 10/2003 | Crowley et al. ...... | 257/787 |
| 2004/0159942 A1 * | 8/2004 | Kinsman ............ | 257/734 |
| 2004/0164382 A1 * | 8/2004 | Gerber et al. ....... | 257/666 |
| 2004/0251557 A1 * | 12/2004 | Kee ................ | 257/777 |
| 2005/0001294 A1 * | 1/2005 | Li et al. .......... | 257/666 |
| 2005/0001328 A1 * | 1/2005 | Tsai et al. ........ | 257/777 |
| 2006/0081967 A1 * | 4/2006 | Ha et al. .......... | 257/676 |
| 2006/0261453 A1 * | 11/2006 | Lee et al. ......... | 257/676 |

\* cited by examiner

*Primary Examiner* — Eugene Lee
*Assistant Examiner* — Peniel M Gumedzoe
(74) *Attorney, Agent, or Firm* — Mikio Ishimaru

(57) ABSTRACT

An integrated circuit package system includes: forming a die-attach paddle, an outer interconnect, and an inner interconnect toward the die-attach paddle beyond the outer interconnect; mounting an integrated circuit device over the die-attach paddle; connecting the integrated circuit device to the inner interconnect and the outer interconnect; encapsulating the integrated circuit device over the die-attach paddle; attaching an external interconnect under the outer interconnect; and attaching a circuit device under the die-attach paddle and extended laterally beyond opposite sides of the die-attach paddle.

20 Claims, 5 Drawing Sheets

INTEGRATED CIRCUIT PACKAGE SYSTEM WITH MULTIPLE DEVICES

TECHNICAL FIELD

The present invention relates generally to an integrated circuit package system and more particularly to an integrated circuit package system with a multiple devices.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Every new generation of integrated circuits with increased operating frequency, performance and the higher level of large-scale integration have underscored the need for back-end integrated circuit manufacturing to provide more solutions involving the integrated circuit itself.

Numerous technologies have been developed to meet these requirements. Some of the research and development strategies focus on new package technologies while others focus on improving the existing and mature package technologies. Both approaches may include additional processing of the integrated circuits to better match the targeted package.

The continued emphasis in the package technology is to implement integration on the "z-axis," that is, by stacking multiple chips in one package or by stacking one package on another package. This provides a dense chip structure having the footprint of a one-chip package. The cost of a stacked structure is only incrementally higher than the cost of a single die package and the assembly yields are high enough to assure a competitive final cost as compared to packaging the die in individual packages. The primary practical limitations to the general stacked structure approach are the low final yield and high testing cost.

For the multiple chips in one package approach, it is inevitable that some of the chip in the package will be defective to some extent, and therefore the final package test yield will be the product of the individual chip test yields, each of which is always less than one hundred percent. This can be particularly a problem even if only two chips are stacked in a package but one of them has low yield because of design complexity or technology.

For the package-on-package module approach, the problem is that the entire module can only be tested after the entire module is mounted on the printed circuit board. If either one package is faulty or the mounting process is faulty, the entire module has to be removed from the printed circuit board. This will inevitably increase the testing cost.

Still thinner, smaller, and lighter package designs and integrated circuit designs and printed circuit designs have been adopted in response to continuing requirements for further miniaturization. At the same time, users are demanding the entire system, including integrated circuit, packages and printed circuit board that are more reliable under increasingly severe operating conditions.

Thus, a need still remains for an integrated circuit package system providing low cost manufacturing, improved yield, improved reliability, and greater flexibility to offer more functionality and fewer footprints on the printed circuit board. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: forming a die-attach paddle, an outer interconnect, and an inner interconnect toward the die-attach paddle beyond the outer interconnect; mounting an integrated circuit device over the die-attach paddle; connecting the integrated circuit device to the inner interconnect and the outer interconnect; encapsulating the integrated circuit device over the die-attach paddle; attaching an external interconnect under the outer interconnect; and attaching a circuit device under the die-attach paddle and extended laterally beyond opposite sides of the die-attach paddle.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
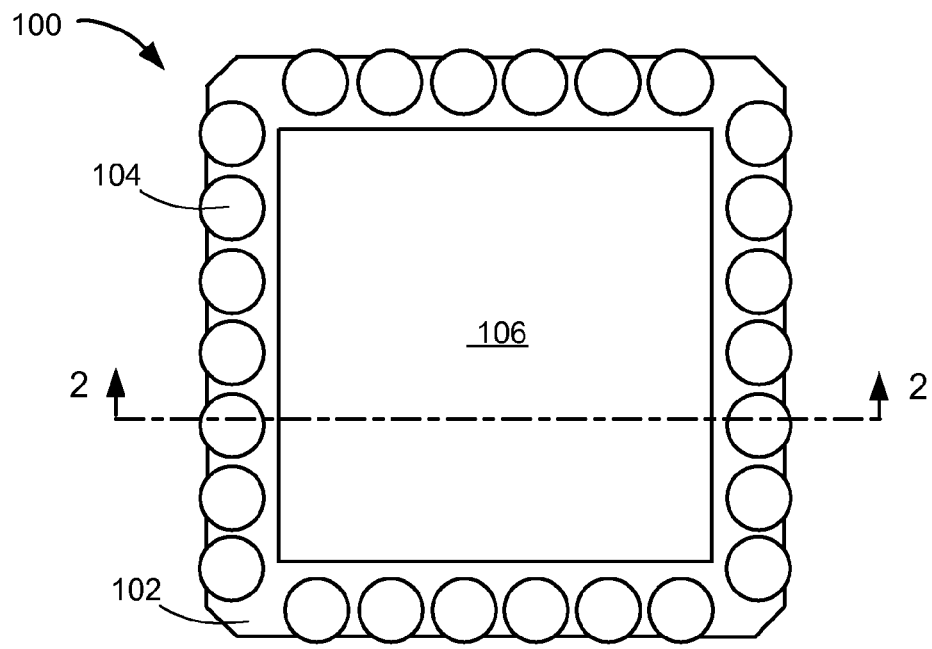
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package system 100 in a first embodiment of the present invention. The bottom view shows a package encapsulation 102, such as an epoxy molding compound, preferably below a single row of external interconnects 104, such as solder balls. The external interconnects 104 extend beyond the boundary of the package encapsulation 102, as an example. The bottom view also depicts a single circuit device 106, such as an integrated circuit die, a flip chip, a wafer scale chip package, or a packaged integrated circuit, over the package encapsulation 102 and within the boundary outlined by the external interconnects 104.

For illustrative purposes, the external interconnects 104 are shown in a single row configuration, although it is understood that the external interconnects 104 may be in a different configuration, such as multiple rows. Also for illustrative purposes, the integrated circuit package system 100 has the external interconnects 104 equally spaced, although it is understood that the integrated circuit package system 100 may have some sites depopulated such that the integrated circuit package system 100 may have the external interconnects 104 not equally spaced.

Figure 2:
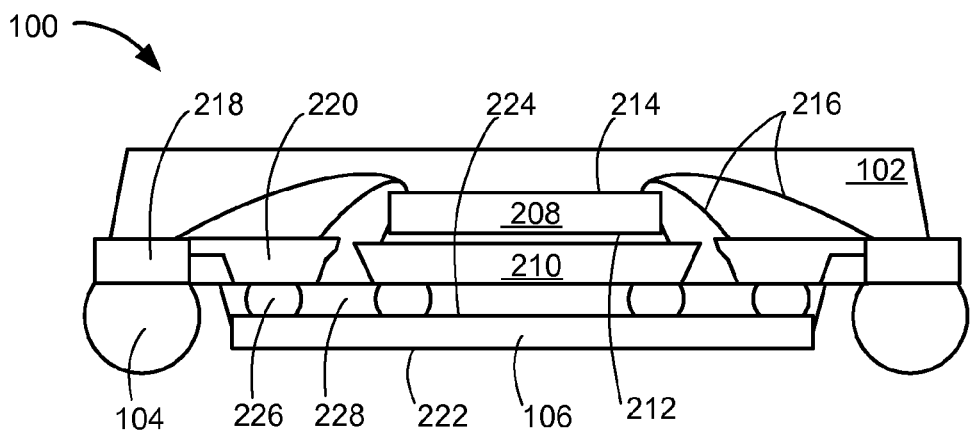
FIG. 2 is a cross-sectional view of the integrated circuit package system along line 2-2 of FIG. 1.

Referring now to FIG. 2, therein is shown a cross-sectional view of the integrated circuit package system 100 along a line 2-2 of FIG. 1. The cross-sectional view depicts an integrated circuit device 208 and the circuit device 106 in the integrated circuit package system 100. The integrated circuit package system 100 is preferably a dual-row Quad Flat Non-Leaded (QFN) package with the integrated circuit device 208 preferably mounted over a die-attach paddle 210. The integrated circuit device 208 has a first non-active side 212 and a first active side 214, wherein the first active side 214 includes active circuitry fabricated thereon. The first non-active side 212 is preferably facing the die-attach paddle 210.

Internal interconnects 216, such as bond wires, preferably connect the first active side 214 with a predetermined selection of both outer interconnects 218, such as outer leads, and inner interconnects 220, such as inner leads. The external interconnects 104 are preferably attached to the outer interconnects 218 at the opposing side of the internal interconnects 216. In the example shown in FIG. 2, the external interconnects 104 attached to the outer interconnects 218 extend beyond the boundary of the package encapsulation 102. The package encapsulation 102 preferably covers the integrated circuit device 208 and the internal interconnects 216 over the die-attach paddle 210, the outer interconnects 218, and the inner interconnects 220. The package encapsulation 102 also preferably exposes a portion of the outer interconnects 218, the inner interconnects 220, and the die-attach paddle 210. For illustrative purposes, the integrated circuit package system 100 is shown as a punch type package, although it is understood that the integrated circuit package system 100 may be formed in a different configuration, such as a sawn-type package.

In the example shown in FIG. 2, the integrated circuit package system 100 is shown with one row of the outer interconnects 218 and one row of the inner interconnects 220, although, it is understood that the integrated circuit package system 100 may have more than one row of the outer interconnects 218, the inner interconnects 220, or a combination thereof. Also in this example, the integrated circuit package system 100 is shown with the outer interconnects 218 electrically connected with the integrated circuit device 208 by the internal interconnects 216, although, it is understood that not all the outer interconnects 218 in the row are electrically connected with the integrated circuit device 208 by the internal interconnects 216.

As mentioned earlier, the circuit device 106 is preferably a flip chip, an integrated circuit die, or a wafer-level chip scale package mounted under the die-attach paddle 210 and extended laterally beyond opposite sides of the die-attach paddle 210. The circuit device 106 has a second non-active side 222 and a second active side 224, wherein the second active side 224 includes active circuitry fabricated thereon. The second active side 224 is preferably facing the die-attach paddle 210. The second active side 224 also preferably has bumps 226, such as solder bumps, for electrical connections. The bumps 226 preferably connect the circuit device 106 with both a predetermined selection of the inner interconnects 220 and the die-attach paddle 210. An under-fill 228 preferably fills the space between the bumps 226 to secure the circuit device 106.

For illustrative purposes, the circuit device 106 is shown with the bumps 226 connected to the die-attach paddle 210 and the inner interconnects 220, although, it is understood that each of the bumps 226 may not connect to the inner interconnects 220 or the die-attach paddle 210. Also for illustrative purposes, the integrated circuit package system 100 is shown with the inner interconnects 220 electrically connected with the integrated circuit device 208 by the internal interconnects 216 and electrically connected with the circuit device 106 by the bumps 226, although, it is understood that not all the inner interconnects 220 are electrically connected with the integrated circuit device 208 and the circuit device 106.

Figure 3:
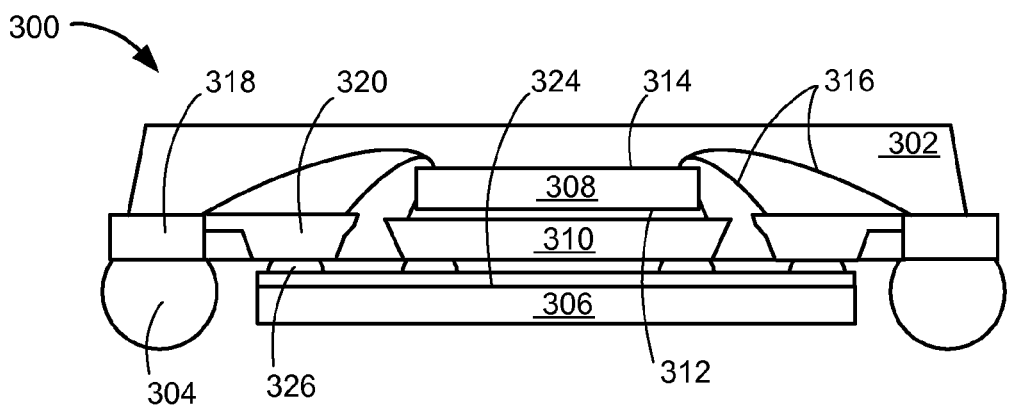
FIG. 3 is a cross-sectional view of an integrated circuit package system exemplified by the bottom view of FIG. 1 in a second embodiment of the present invention.

Referring now to FIG. 3, therein is shown a cross-sectional view of an integrated circuit package system 300 as exemplified by the bottom view of FIG. 1 along line 2-2 of FIG. 1 in a second embodiment of the present invention. The cross-sectional view depicts an integrated circuit device 308 and a circuit device 306 in the integrated circuit package system 300. The integrated circuit package system 300 is preferably a dual-row QFN with the integrated circuit device 308 mounted over a die-attach paddle 310. The integrated circuit device 308 has a first non-active side and a first active side 314, wherein the first active side 314 includes active circuitry fabricated thereon. A first non-active side 312 is preferably facing the die-attach paddle 310.

Internal interconnects 316, such as bond wires, preferably connect the first active side 314 with a predetermined selection of both outer interconnects 318, such as outer leads, and inner interconnects 320, such as inner leads. External interconnects 304, such as solder balls, are preferably attached to the outer interconnects 318 at the opposing side of the internal interconnects 316. In the example shown in FIG. 3, the external interconnects 304 attached to the outer interconnects 318 extend beyond the boundary of a package encapsulation 302, such as an epoxy molding compound. The package encapsulation 302 preferably covers the integrated circuit device 308 and the internal interconnects 316 over the die-attach paddle 310, the outer interconnects 318, and the inner interconnects 320. The package encapsulation 302 also preferably exposes a portion of the outer interconnects 318, the inner interconnects 320, and the die-attach paddle 310. For illustrative purposes, the integrated circuit package system 300 is shown as a punch type package, although it is understood that the integrated circuit package system 300 may be formed in a different configuration, such as a sawn-type package.

In the example shown in FIG. 3, the integrated circuit package system 300 is shown with one row of the outer interconnects 318 and one row of the inner interconnects 320, although, it is understood that the integrated circuit package system 300 may have different number of rows for the outer interconnects 318 and the inner interconnects 320. Also for example, the integrated circuit package system 300 is shown with the outer interconnects 318 electrically connected with the integrated circuit device 308 by the internal interconnects 316, although, it is understood that not all the outer interconnects 318 are electrically connected with the integrated circuit device 308 by the internal interconnects 316.

The circuit device 306 is preferably a ball grid array (BGA) packaged integrated circuit or a land grid array (LGA) packaged integrated circuit, mounted under the die-attach paddle 310 and extended laterally beyond opposite sides of the die-attach paddle 310. The circuit device 306 has a second non-active side and a second active side 324, wherein the second active side 324 includes active circuitry fabricated thereon. The second active side 324 is facing the die-attach paddle 310. The second active side 324 also has bumps 326, such as solder bumps, for electrical connections. The bumps 326 preferably connect the circuit device 306 with both a predetermined selection of the inner interconnects 320 and the die-attach paddle 310.

For illustrative purposes, the circuit device 306 is shown with the bumps 326 connected to the die-attach paddle 310 and the inner interconnects 320, although, it is understood that the bumps 326 may not connect to the inner interconnects 320 or the die-attach paddle 310. Also for illustrative purposes, the integrated circuit package system 300 is shown with the inner interconnects 320 electrically connected with the integrated circuit device 308 by the internal interconnects 316 and electrically connected with the circuit device 306 by the bumps 326, although, it is understood that not all the inner interconnects 320 are electrically connected with the integrated circuit device 308 and the circuit device 306.

Figure 4:
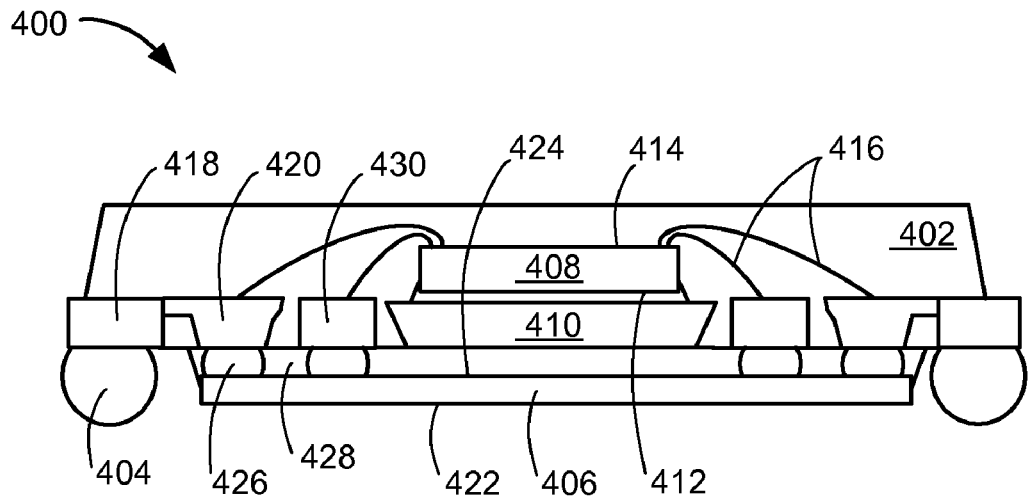
FIG. 4 is a cross-sectional view of an integrated circuit package system exemplified by the bottom view of FIG. 1 in a third embodiment of the present invention.

Referring now to FIG. 4, therein is shown a cross-sectional view of an integrated circuit package system 400 exemplified by the bottom view of FIG. 4 in a third embodiment of the present invention. The cross-sectional view depicts an integrated circuit device 408 and a circuit device 406 in the integrated circuit package system 400. The integrated circuit package system 400 is preferably a multiple-row Quad Flat Non-Leaded (QFN) package with the integrated circuit device 408 preferably mounted over a die-attach paddle 410. The integrated circuit device 408 has a first non-active side 412 and a first active side 414, wherein the first active side 414 includes active circuitry fabricated thereon. The first non-active side 412 is preferably facing the die-attach paddle 410.

Internal interconnects 416, such as bond wires, preferably connect the first active side 414 with a predetermined selection of outer interconnects 418, such as outer leads, inner interconnects 420, such as inner leads, and innermost interconnects 430, such as innermost leads. The inner interconnects 420 are preferably located between the outer interconnects 418 and the innermost interconnects 430.

External interconnects 404, such as solder balls, are preferably attached to the outer interconnects 418 at the opposing side of the internal interconnects 416. In the example shown in FIG. 4, the external interconnects 404 attached to the outer interconnects 418 extend beyond the boundary of a package encapsulation 402, such as an epoxy molding compound. The package encapsulation 402 preferably covers the integrated circuit device 408 and the internal interconnects 416 over the die-attach paddle 410, the outer interconnects 418, and the inner interconnects 420. The package encapsulation 402 also preferably exposes a portion of the outer interconnects 418, the inner interconnects 420, and the die-attach paddle 410. For illustrative purposes, the integrated circuit package system 400 is shown as a punch type package, although it is understood that the integrated circuit package system 400 may be formed in a different configuration, such as a sawn-type package.

In the example shown in FIG. 4, the integrated circuit package system 400 is shown with one row of the outer interconnects 418, one row of the inner interconnects 420, and one row of the innermost interconnects 430, although, it is understood that the integrated circuit package system 400 may have different rows of the outer interconnects 418, the inner interconnects 420, and the innermost interconnects 430. Also for example, the integrated circuit package system 400 is shown with the outer interconnects 418 electrically connected with the integrated circuit device 408 by the internal interconnects 416, although, it is understood that not all the outer interconnects 418 are electrically connected with the integrated circuit device 408 by the internal interconnects 416.

The circuit device 406 is preferably a flip chip, an integrated circuits die, or a wafer-level chip scale package being centrally mounted under the die-attach paddle 410 and being extended laterally beyond opposite sides of the die-attach paddle 410. The circuit device 406 has a second non-active side 422 and a second active side 424, wherein the second active side 424 includes active circuitry fabricated thereon. The second active side 424 is preferably facing the die-attach paddle 410. The second active side 424 also preferably has bumps 426, such as solder bumps, for electrical connections. The bumps 426 preferably connect the circuit device 406 with both a predetermined selection of the inner interconnects 420, the innermost interconnects 430, and the die-attach paddle

410. An under-fill 428 preferably fills the space between the bumps 426 to secure the circuit device 406.

For illustrative purposes, the circuit device 406 is shown with the bumps 426 connected to the die-attach paddle 410, the inner interconnects 420, and the innermost interconnects 430, although, it is understood that the bumps 426 may not connect to the inner interconnects 420, the innermost interconnects 430, or the die-attach paddle 410. Also for illustrative purposes, the integrated circuit package system 400 is shown with the inner interconnects 420 and the innermost interconnects 430 electrically connected with the integrated circuit device 408 by the internal interconnects 416 and electrically connected with the circuit device 406 by the bumps 426, although, it is understood that not all the inner interconnects 420 and the innermost interconnects 430 are electrically connected with the integrated circuit device 408 and the circuit device 406.

Figure 5:
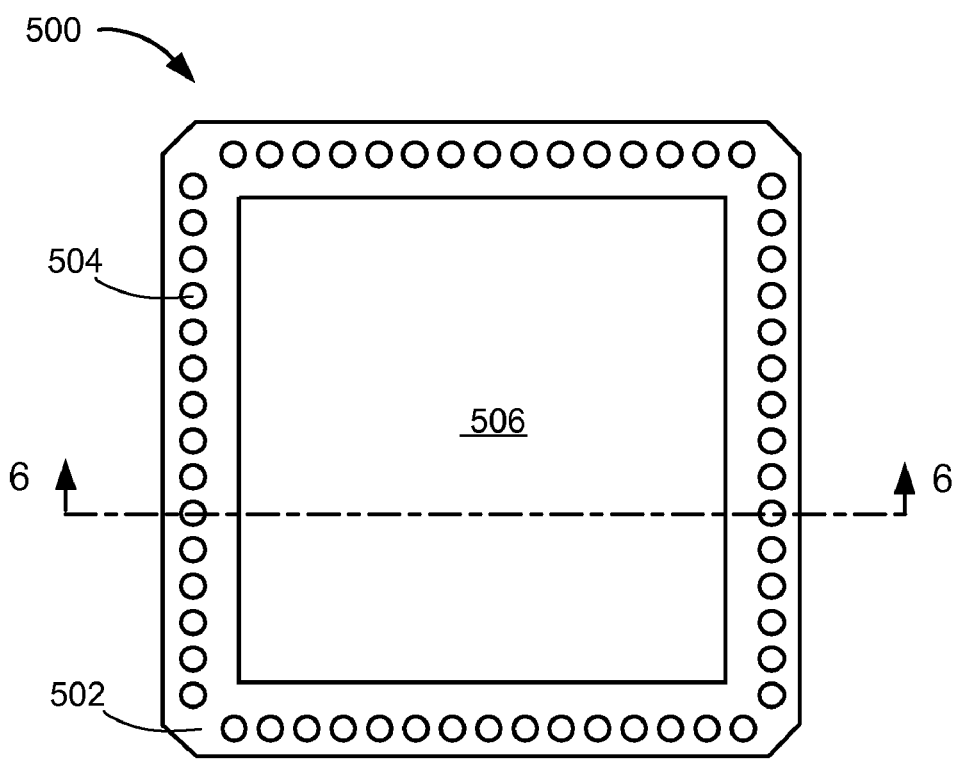
FIG. 5 is a bottom view of an integrated circuit package system in a fourth embodiment of the present invention.

Referring now to FIG. 5, therein is shown a bottom view of an integrated circuit package system 500 in a fourth embodiment of the present invention. The bottom view shows a package encapsulation 502, such as an epoxy molding compound, preferably below a single row of external interconnects 504, such as solder balls. The external interconnects 504 do not extend beyond the boundary of the package encapsulation 502. The bottom view also depicts a circuit device 506, such as an integrated circuit die, a flip chip, a wafer scale chip package, or a packaged integrated circuit, over the package encapsulation 502 and beyond the boundary outlined by the external interconnects 504.

For illustrative purposes, the external interconnects 504 are shown in a single row configuration, although it is understood that the external interconnects 504 may be in a different configuration, such as multiple rows. Also for illustrative purposes, the integrated circuit package system 500 has the external interconnects 504 equally spaced, although it is understood that the integrated circuit package system 500 may have some sites depopulated such that the integrated circuit package system 500 may have the external interconnects 504 unequally spaced.

Figure 6:
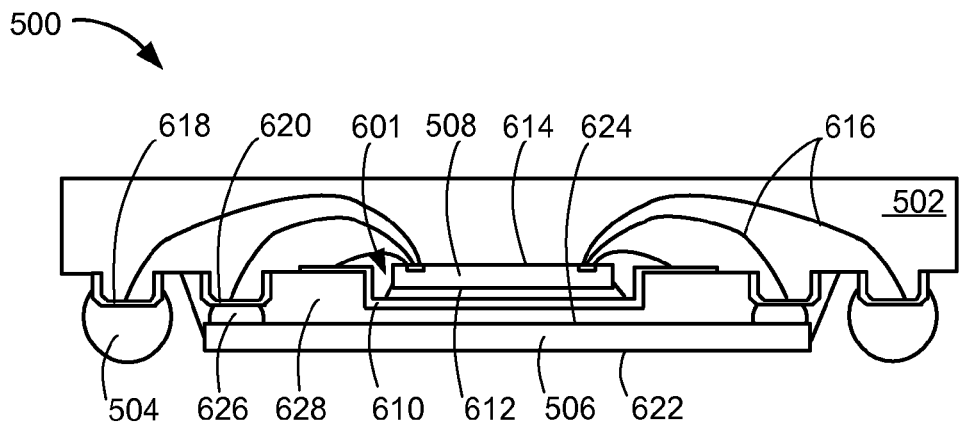
FIG. 6 is a cross-sectional view of the integrated circuit package system along line 6-6 of FIG. 5.

Referring now to FIG. 6, therein is shown a cross-sectional view of the integrated circuit package system 500 along line 6-6 of FIG. 5. The cross-sectional view depicts an integrated circuit device 508, such as an integrated circuit die, and the circuit device 506 in the integrated circuit package system 500. The integrated circuit package system 500 is preferably a dual-row bump chip carrier with the integrated circuit device 508 preferably mounted in a recess 601 of a die-attach paddle 610. The integrated circuit device 508 has a first non-active side 612 and a first active side 614, wherein the first active side 614 includes active circuitry fabricated thereon. The first non-active side 612 is preferably facing the die-attach paddle 610.

Internal interconnects 616, such as bond wires, preferably connect the first active side 614 with a predetermined selection of both outer interconnects 618, such as outer bump terminals, and inner interconnects 620, such as inner bump terminals. The internal interconnects 616 also preferably connect the integrated circuit device 508 and a portion of the die-attach paddle 610 adjacent to the recess 601 providing a number of functions. For example, the connections to the die-attach paddle 610 may function as a ground bonding site or allow the die-attach paddle 610 tied to ground to function as an electromagnetic interference (EMI) shield.

The external interconnects 504 are preferably attached to the outer interconnects 618 at the opposing side of the internal interconnects 616. In the example shown in FIG. 6, the external interconnects 504 attached to the outer interconnects 618 do not extend beyond the boundary of the package encapsulation 502, such as an epoxy molding compound.

The package encapsulation 502 preferably covers the integrated circuit device 508 and the internal interconnects 616 over the die-attach paddle 610, the outer interconnects 618, and the inner interconnects 620. The package encapsulation 502 also preferably exposes a portion of the outer interconnects 618, the inner interconnects 620, and the die-attach paddle 610. The package encapsulation 502 preferably fills in the outer interconnects 618, the inner interconnects 620, and the recess 601 of the die-attach paddle 610. The outer interconnects 618, the inner interconnects 620, and the die-attach paddle 610 are preferably not coplanar with the package encapsulation 502.

In the example shown in FIG. 6, the integrated circuit package system 500 is shown with one row of the outer interconnects 618 and one row of the inner interconnects 620, although, it is understood that the integrated circuit package system 500 may have more than one row of the outer interconnects 618, the inner interconnects 620, or a combination thereof. Also in this example, the integrated circuit package system 500 is shown with the outer interconnects 618 electrically connected with the integrated circuit device 508 by the internal interconnects 616, although, it is understood that not all the outer interconnects 618 are electrically connected with the integrated circuit device 508 by the internal interconnects 616.

As mentioned earlier, the circuit device 506 is preferably a flip chip, an integrated circuit die, or a wafer-level chip scale package, mounted under the die-attach paddle 610 and extended laterally beyond opposite sides of the recess 601. The circuit device 506 has a second non-active side 622 and a second active side 624, wherein the second active side 624 includes active circuitry fabricated thereon. The second active side 624 is preferably facing the die-attach paddle 610. The second active side 624 also preferably has bumps 626, such as solder bumps, for electrical connections. The bumps 626 preferably connect the circuit device 506 with a predetermined selection of the inner interconnects 620. An under-fill 628 preferably fills the space between the bumps 626 to secure the circuit device 506.

For illustrative purposes, the circuit device 506 is shown with the bumps 626 connected to the inner interconnects 620, although, it is understood that each of the bumps 626 may not connect to the inner interconnects 620. Also for illustrative purposes, the integrated circuit package system 500 is shown with the inner interconnects 620 electrically connected with the integrated circuit device 508 by the internal interconnects 616 and electrically connected with the circuit device 506 by the bumps 626, although it is understood that not all the inner interconnects 620 are electrically connected with the integrated circuit device 508 and the circuit device 506.

Figure 7:
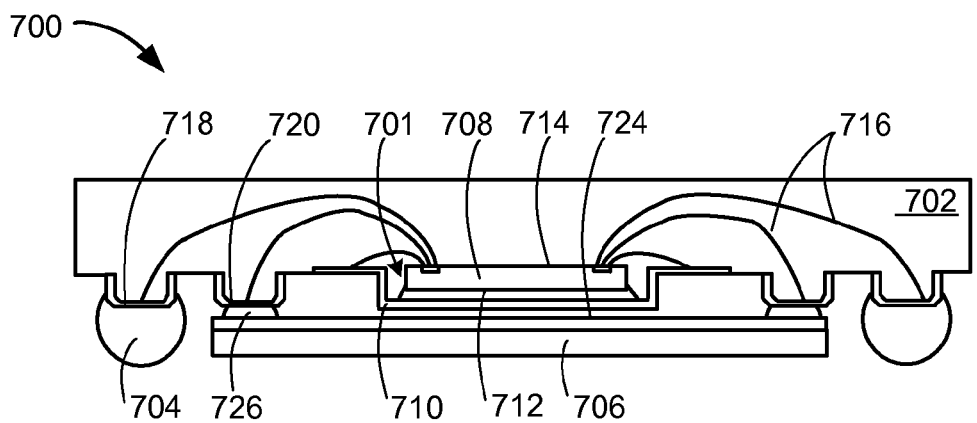
FIG. 7 is a cross-sectional view of an integrated circuit package system exemplified by the bottom view of FIG. 5 in a fifth embodiment of the present invention.

Referring now to FIG. 7, therein is shown a cross-sectional view of an integrated circuit package system 700 as exemplified by the bottom view of FIG. 5 along line 6-6 of FIG. 5 in a fifth embodiment of the present invention. The cross-sectional view depicts an integrated circuit device 708, such as integrated circuit die, and a circuit device 706, such as a packaged integrated circuit, in the integrated circuit package system 700. The integrated circuit device 708 is preferably a dual-row bump chip carrier with the integrated circuit device 708 preferably mounted in a recess 701 of a die-attach paddle 710. The integrated circuit device 708 has a first non-active side and a first active side 714, wherein the first active side 714 includes active circuitry fabricated thereon. A first non-active side 712 is preferably facing the die-attach paddle 710.

Internal interconnects 716, such as bond wires, preferably connect the first active side 714 with a predetermined selection of both outer interconnects 718, such as outer bump terminals, and inner interconnects 720, such as inner bump terminals. The internal interconnects 716 also preferably connect the integrated circuit device 708 and a portion of the die-attach paddle 710 adjacent to the recess 701 providing a number of functions. For example, the connections to the die-attach paddle 710 may function as a ground bonding site or allow the die-attach paddle 710 tied to ground to function as an electromagnetic interference (EMI) shield.

External interconnects 704 are preferably attached to the outer interconnects 718 at the opposing side of the internal interconnects 716. In the example shown in FIG. 7, the external interconnects 704 attached to the outer interconnects 718 do not extend beyond the boundary of a package encapsulation 702, such as an epoxy molding compound.

The package encapsulation 702 preferably covers the integrated circuit device 708 in the recess 701, the internal interconnects 716, the outer interconnects 718, and the inner interconnects 720. The package encapsulation 702 also preferably exposes a portion of the outer interconnects 718, the inner interconnects 720, and the die-attach paddle 710. The package encapsulation 702 preferably fills in the outer interconnects 718, the inner interconnects 720, and the recess 701 of the die-attach paddle 710. The outer interconnects 718, the inner interconnects 720, and the die-attach paddle 710 are preferably not coplanar with the package encapsulation 702.

In the example shown in FIG. 7, the integrated circuit package system 700 is shown with one row of the outer interconnects 718 and one row of the inner interconnects 720, although, it is understood that the integrated circuit package system 700 may have different number of rows for the outer interconnects 718 and the inner interconnects 720. Also for example, the integrated circuit package system 700 is shown with the outer interconnects 718 electrically connected with the integrated circuit device 708 by the internal interconnects 716, although, it is understood that not all the outer interconnects 718 are electrically connected with the integrated circuit device 708 by the internal interconnects 716.

The circuit device 706 is preferably a ball grid array (BGA) packaged integrated circuits or a land grid array (LGA) packaged integrated circuits, mounted under the die-attach paddle 710 and extended laterally beyond opposite sides of the recess 701. The circuit device 706 has a second non-active side and a second active side 724, wherein the second active side 724 includes active circuitry fabricated thereon. The second active side 724 is facing the die-attach paddle 710. The second active side 724 also has bumps 726, such as solder bumps, for electrical connections. The bumps 726 preferably connect the circuit device 706 with a predetermined selection of the inner interconnects 720.

For illustrative purposes, the circuit device 706 is shown with the bumps 726 connected to the die-attach paddle 710 and the inner interconnects 720, although, it is understood that the bumps 726 may not connect to the inner interconnects 720 or the die-attach paddle 710. Also for illustrative purposes, the integrated circuit package system 700 is shown with the inner interconnects 720 electrically connected with the integrated circuit device 708 by the internal interconnects 716 and electrically connected with the circuit device 706 by the bumps 726, although, it is understood that not all the inner interconnects 720 are electrically connected with the integrated circuit device 708 and the circuit device 706.

Figure 8:
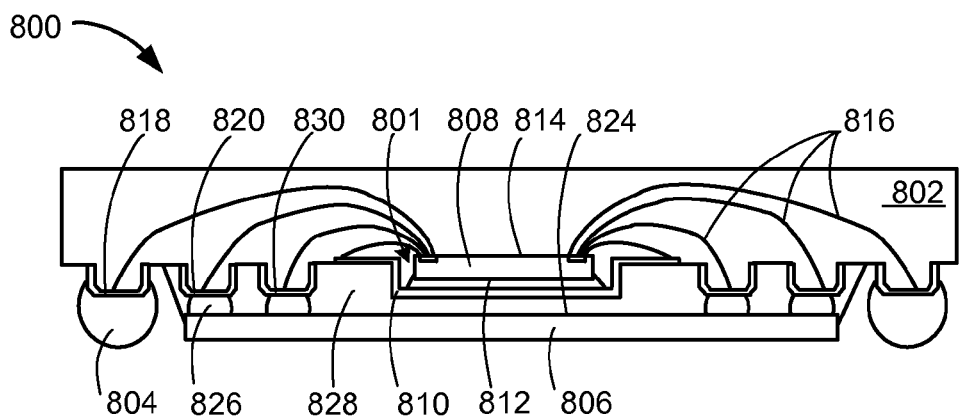
FIG. 8 is a cross-sectional view of an integrated circuit package system exemplified by the bottom view of FIG. 5 in a sixth embodiment of the present invention.

Referring now to FIG. 8, therein is shown a cross-sectional view of an integrated circuit package system 800 exemplified by the bottom view of FIG. 5 in a sixth embodiment of the present invention. The cross-sectional view depicts an integrated circuit device 808, such as an integrated circuit die, and a circuit device 806, such as a flip chip, in the integrated circuit package system 800. The integrated circuit package system 800 is preferably a multiple-row bump chip carrier with the integrated circuit device 808 preferably mounted in a recess 801. The integrated circuit device 808 has a first non-active side and a first active side 814, wherein the first active side 814 includes active circuitry fabricated thereon. A first non-active side 812 is preferably facing a die-attach paddle 810.

Internal interconnects 816, such as bond wires, preferably connect the first active side 814 with a predetermined selection of outer interconnects 818, such as outer bump terminals, inner interconnects 820, such as inner bump terminals, and innermost interconnects 830, such as innermost bump terminals. The inner interconnects 820 are preferably located between the outer interconnects 818 and the innermost interconnects 830. The internal interconnects 816 also preferably connect the integrated circuit device 808 and a portion of the die-attach paddle 810 adjacent to the recess 801 providing a number of functions. For example, the connections to the die-attach paddle 810 may function as a ground bonding site or allow the die-attach paddle 810 tied to ground to function as an electromagnetic interference (EMI) shield.

External interconnects 804, such as solder balls, are preferably attached to the outer interconnects 818 at the opposing side of the internal interconnects 816. In the example shown in FIG. 8, the external interconnects 804 attached to the outer interconnects 818 do not extend beyond the boundary of a package encapsulation 802, such as an epoxy molding compound. The package encapsulation 802 preferably covers the integrated circuit device 808, the internal interconnects 816, the outer interconnects 818, and the inner interconnects 820. The package encapsulation 802 also preferably exposes a portion of the outer interconnects 818, the inner interconnects 820, and the die-attach paddle 810. The package encapsulation 802 preferably fills in the outer interconnects 818, the inner interconnects 820, the innermost interconnects 830, and the recess 801 of the die-attach paddle 810. The outer interconnects 818, the inner interconnects 820, the innermost interconnects 830, and the die-attach paddle 810 are preferably not coplanar with the package encapsulation 802.

In the example shown in FIG. 7, the integrated circuit package system 800 is shown with one row of the outer interconnects 818 and one row of the inner interconnects 820, and one row of the innermost interconnects 830, although, it is understood that the integrated circuit package system 800 may have different rows of the outer interconnects 818, the inner interconnects 820, and the innermost interconnects 830. Also for example, the integrated circuit package system 800 is shown with the outer interconnects 818 electrically connected with the integrated circuit device 808 by the internal interconnects 816, although, it is understood that not all the outer interconnects 818 are electrically connected with the integrated circuit device 808 by the internal interconnects 816.

The circuit device 806 is preferably a flip chip, integrated circuits, or a wafer-level chip scale package, mounted under the die-attach paddle 810 and extended laterally beyond opposite sides of the recess 801. The circuit device 806 has a second non-active side and a second active side 824, wherein the second active side 824 includes active circuitry fabricated thereon. The second active side 824 is preferably facing the die-attach paddle 810. The second active side 824 also has bumps 826, such as solder bumps, for electrical connections. The bumps 826 preferably connect the circuit device 806 with a predetermined selection of the inner interconnects 820. An under-fill 828 preferably fills the space between the bumps 826 to secure the circuit device 806.

For illustrative purposes, the circuit device 806 is shown with the bumps 826 connected to the die-attach paddle 810, the inner interconnects 820, and the innermost interconnects 830, although, it is understood that each of the bumps 826 may not connect to the inner interconnects 820 and the innermost interconnects 830. Also for illustrative purposes, the integrated circuit package system 800 is shown with the inner interconnects 820 and the innermost interconnects 830 electrically connected with the integrated circuit device 808 by the internal interconnects 816 and electrically connected with the circuit device 806 by the bumps 826, although, it is understood that not all the inner interconnects 820 and the innermost interconnects 830 are electrically connected with the integrated circuit device 808 and the circuit device 806.

Figure 9:
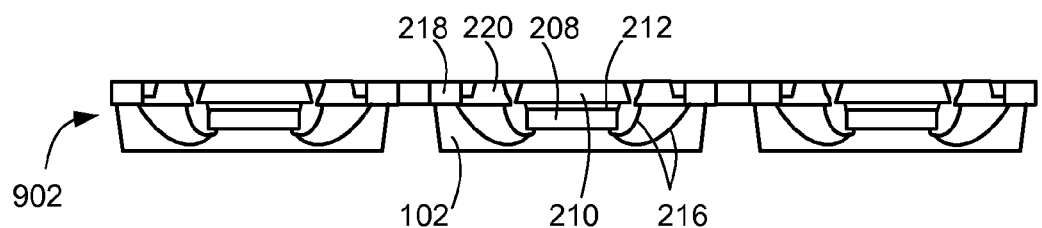
FIG. 9 is a cross-sectional view of the integrated circuit package system of FIG. 2 in a forming phase of a molded strip.

Referring now to FIG. 9, therein is a cross-sectional view of the integrated circuit package system 100 of FIG. 2 in a forming phase of a molded strip 902. The molded strip 902 includes the integrated circuit device 208 mounted to the die-attach paddle 210. The first non-active side 212 of the integrated circuit device 208 faces the die-attach paddle 210. The internal interconnects 216 are bonded between the outer interconnects 218 and the integrated circuit device 208 as well as between the inner interconnects 220 and the integrated circuit device 208. The package encapsulation 102 encapsulates the integrated circuit device 208, and the internal interconnects 216.

Figure 10:
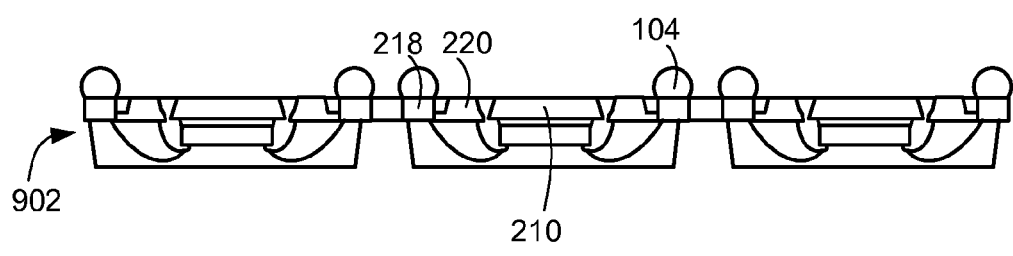
FIG. 10 is the structure of FIG. 9 in a forming phase of the external interconnects.

Referring now to FIG. 10, therein is shown the structure of FIG. 9 in a forming phase of the external interconnects 104. The external interconnects 104 are attached to the outer interconnects 218. For illustrative purposes, the external interconnects 104 are shown formed over the outer interconnects 218, although it is understood that the external interconnects 104 may be formed at other locations of the molded strip 902. For example, the external interconnects 104 may be formed over the inner interconnects 220 and the die-attach paddle 210.

Figure 11:
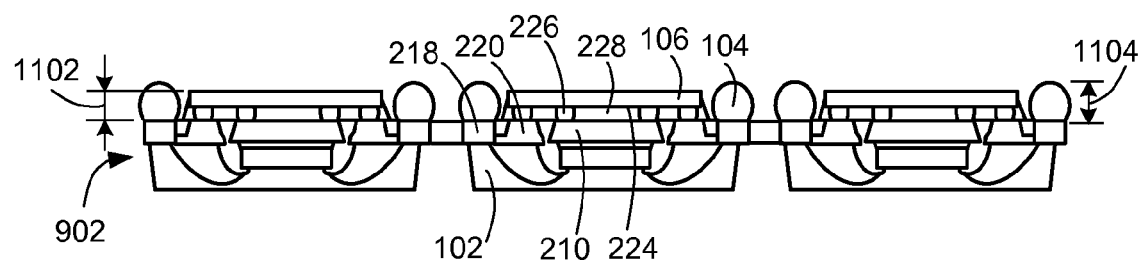
FIG. 11 is the structure of FIG. 10 in a forming phase of attaching the circuit device.

Referring now to FIG. 11, therein is shown the structure of FIG. 10 in a forming phase of attaching the circuit device 106. The circuit device 106 is mounted over the die-attach paddle 210 not covered by the package encapsulation 102. The second active side 224 of the circuit device 106 faces the die-attach paddle 210. The bumps 226 of the circuit device 106 are attached to the inner interconnects 220 and the die-attach paddle 210. The under-fill 228 is applied to secure and electrically insulate the bumps 226.

A device height 1102 of the circuit device 106 over the die-attach paddle 210 is less than an interconnect height 1104 of the external interconnects 104 over the outer interconnects 218 such that the circuit device 106 does not impede the connections of the external interconnects 104 to the next system level (not shown), such as a printed circuit board or another integrated circuit package system. The molded strip 902 is shown with the outer interconnects 218, the inner interconnects 220, and the die-attach paddle 210 preferably coplanar at the side exposed by the package encapsulation 102.

Figure 12:
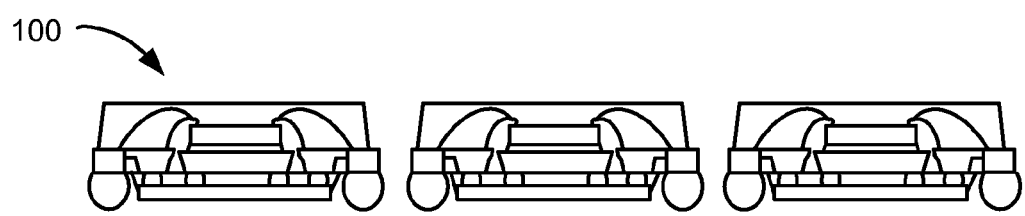
FIG. 12 is the structure of FIG. 11 in a forming phase of the integrated circuit package system.

Referring now to FIG. 12, therein is shown the structure of FIG. 11 in a forming phase of the integrated circuit package system 100. The structure of FIG. 12 is in a vertically flipped orientation as in FIG. 11. The molded strip 902 of FIG. 11 undergoes a singulation process forming the integrated circuit package system 100. The singulated portions may undergo other processes, such as cleaning.

Figure 13:
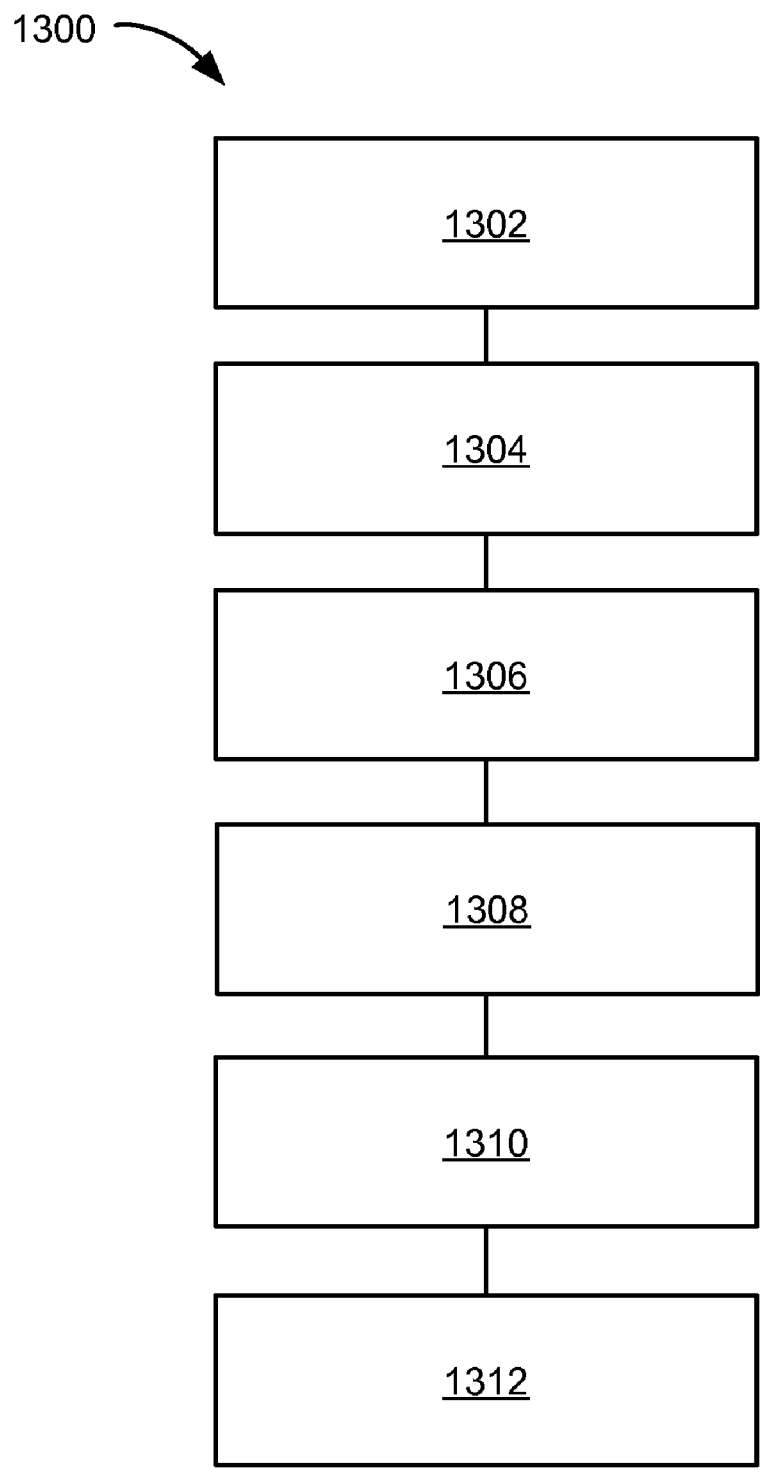
FIG. 13 is a flow chart of an integrated circuit package system for manufacturing of the integrated circuit package system in an embodiment of the present invention.

Referring now to FIG. 13, therein is shown a flow chart of an integrated circuit package system 1300 for manufacturing the integrated circuit package system 100 in an embodiment of the present invention. The system 1300 includes forming a die-attach paddle, an outer interconnect, and an inner interconnect toward the die-attach paddle beyond the outer interconnect in a block 1302; mounting an integrated circuit device over the die-attach paddle in a block 1304; connecting the integrated circuit device to the inner interconnect and the outer interconnect in a block 1306; encapsulating the integrated circuit device over the die-attach paddle in a block 1308; attaching an external interconnect under the outer interconnect in a block 1310; and attaching a circuit device under the die-attach paddle and extended laterally beyond opposite sides of the die-attach paddle in a block 1312.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    forming a die-attach paddle;
    forming an outer interconnect adjacent to the die attach paddle;
    forming an inner interconnect extended toward the die-attach paddle more than the outer interconnect;
    mounting an integrated circuit device over the die-attach paddle;
    connecting the integrated circuit device to the inner interconnect and the outer interconnect;
    encapsulating a portion of the outer interconnect and the integrated circuit device over the die-attach paddle;
    attaching an external interconnect under the outer interconnect; and
    attaching a non-encapsulated single circuit device being centrally mounted under the die-attach paddle and being extended laterally beyond opposite sides of the die-attach paddle.

2. The method as claimed in claim 1 wherein connecting the integrated circuit device includes connecting the integrated circuit device and the die-attach paddle.

3. The method as claimed in claim 1 wherein attaching the single circuit device under the die-attach paddle includes connecting the circuit device and the inner interconnect.

4. The method as claimed in claim 1 wherein:
    forming the die-attach paddle includes:
        forming the die-attach paddle having a recess; and mounting the integrated circuit device over the die-attach paddle includes:
 mounting the integrated circuit device within the recess.

5. The method as claimed in claim 1 wherein forming the die-attach paddle includes forming an innermost interconnect located toward the die-attach paddle beyond the inner interconnect.

6. A method of manufacture of an integrated circuit package system comprising:
 forming a die-attach paddle;
 forming an outer interconnect adjacent to the die attach paddle;
 forming an inner interconnect extended toward the die-attach paddle more than the outer interconnect;
 mounting an integrated circuit device over the die-attach paddle;
 connecting the integrated circuit device to the inner interconnect and the outer interconnect;
 encapsulating a portion of the outer interconnect and the integrated circuit device over the die-attach paddle;
 attaching an external interconnect under the outer interconnect; and
 attaching a non-encapsulated single circuit device having a bump, the circuit device being centrally mounted under the die-attach paddle and being extended laterally beyond opposite sides of the die-attach paddle with the bump connected to the inner interconnect.

7. The method as claimed in claim 6 wherein attaching the single circuit device includes attaching a flip chip.

8. The method as claimed in claim 6 wherein attaching the single circuit device includes attaching a packaged integrated circuit device.

9. The method as claimed in claim 6 wherein attaching the integrated circuit device includes attaching an integrated circuit die.

10. The method as claimed in claim 6 wherein:
 attaching the external interconnect includes:
  attaching a solder ball having an interconnect height from the outer interconnect; and
 attaching the circuit device having the bump includes:
  attaching the single circuit device having a device height from the outer interconnect with the interconnect height extended beyond the device height from the outer interconnect.

11. An integrated circuit package system comprising:
 a die-attach paddle;
 an outer interconnect adjacent to the die-attach paddle;
 an inner interconnect extended toward the die-attach paddle more than the outer interconnect;
 an integrated circuit device over the die-attach paddle and connected to the inner interconnect and the outer interconnect;
 a package encapsulation on a portion of the outer interconnect and over the integrated circuit device and the die-attach paddle;
 an external interconnect attached under the outer interconnect; and
 a non-encapsulated single circuit device being centrally mounted under the die-attach paddle and being extended laterally beyond opposite sides of the die-attach paddle.

12. The system as claimed in claim 11 wherein the integrated circuit device is connected with the die-attach paddle.

13. The system as claimed in claim 11 wherein the single circuit device under the die-attach paddle includes the single circuit device connected with the inner interconnect.

14. The system as claimed in of claim 11 wherein:
 the die-attach paddle includes a recess; and
 the integrated circuit device over the die-attach paddle includes:
  the integrated circuit device within the recess.

15. The system as claimed in claim 11 further comprising an innermost interconnect located toward the die-attach paddle beyond the inner interconnect.

16. The system as claimed in claim 11 wherein the single circuit device includes a bump and is connected with the inner interconnect.

17. The system as claimed in claim 16 wherein the integrated circuit device includes a flip chip.

18. The system as claimed in claim 16 wherein the single circuit device includes a packaged integrated circuit device.

19. The system as claimed in claim 16 wherein the integrated circuit device includes an integrated circuit die.

20. The system as claimed in claim 16 wherein:
 the external interconnect includes a solder ball having an interconnect height from the outer interconnect; and
 the single circuit device having the bump includes the single circuit device having a device height from the outer interconnect with the interconnect height extended beyond the device height from the outer interconnect.

* * * * *